United States Patent [19]
Morrell

[11] Patent Number: 6,013,571
[45] Date of Patent: Jan. 11, 2000

[54] MICROELECTRONIC ASSEMBLY INCLUDING COLUMNAR INTERCONNECTIONS AND METHOD FOR FORMING SAME

[75] Inventor: Michelle J. Morrell, Glen Ellyn, Ill.

[73] Assignee: Motorola, Inc., Schaumburg, Ill.

[21] Appl. No.: 08/876,582

[22] Filed: Jun. 16, 1997

[51] Int. Cl.$^7$ .................................................. H01L 21/44
[52] U.S. Cl. .......................... 438/612; 638/614; 638/615
[58] Field of Search ................................ 438/612, 614, 438/615, 687

[56] References Cited

U.S. PATENT DOCUMENTS

| | | | |
|---|---|---|---|
| 5,130,275 | 7/1992 | Dion | 438/614 |
| 5,270,253 | 12/1993 | Arai et al. | 438/612 |
| 5,466,635 | 11/1995 | Lynch et al. | 438/614 |
| 5,670,418 | 9/1997 | Ghosal | 438/614 |
| 5,759,910 | 6/1998 | Mangold et al. | 438/614 |
| 5,786,238 | 7/1998 | Pai et al. | 438/614 |

*Primary Examiner*—Kevin M. Picardat
*Attorney, Agent, or Firm*—Douglas D. Fekete

[57] ABSTRACT

A microelectronic assembly (10) is formed and includes an integrated circuit component (12) attached to a substrate (14). The integrated circuit component (12) includes metallic columns (24) formed on bond pads (16) on the component (12). A solder plate (30) is formed on each of the metallic columns (24). The integrated circuit component (12) is superposed onto a substrate (14). The substrate (14) includes substrate bond pads (32), and each metallic column (24) registers with a corresponding substrate bond pad (32) such that the solder plate (30) contacts the substrate bond pad (32) to form a preassembly. The preassembly is then heated to reflow the solder plate (30) to form a solder joint (34) between the integrated circuit component (12) and the substrate (14). The solder joint (34) is formed between the solder attachment surface (28) of the metallic column (24) and the substrate bond pad (32).

14 Claims, 2 Drawing Sheets

MICROELECTRONIC ASSEMBLY INCLUDING COLUMNAR INTERCONNECTIONS AND METHOD FOR FORMING SAME

FIELD OF THE INVENTION

This invention relates generally to a microelectronic assembly and a method for forming the assembly. More particularly, this invention relates to an assembly wherein an integrated circuit component is connected to a substrate by metallic columnar interconnections.

BACKGROUND OF THE INVENTION

Microelectronic assemblies are formed by attaching an integrated circuit component, such as an integrated circuit die, to a substrate, such as a printed circuit board, by solder bump interconnections. This "flip-chip" method is accomplished by superposing solder bumps deposited onto bond pads of the integrated circuit component so that the solder bumps rest against bond pads on the substrate. This preassembly is then heated to reflow the solder. In the product assembly, the component is spaced apart from the substrate by a gap. The solder bump interconnections extend across the gap to physically attach the component to the substrate and electrically connect electrical features on the component to a circuit trace on the substrate to transmit signals to and from the component for processing.

During reflow, the solder bumps collapse. This collapse is a result of the liquefaction of the solder alloy upon heating above the melting temperature of the solder alloy. This collapse leads to a reduced gap between the component and the substrate, and also leads to the solder bumps having an increased width and a decreased height. As the solder liquefies, the component collapses toward the substrate, and a solder bump interconnection is formed in a typically rounded shape, due to surface tension of the solder. When the collapse of the component is relatively large, the increase in width of the solder joints can lead to shorts between adjacent solder joints.

In addition, the collapse of the solder bumps during reflow leads to a decrease in the standoff. Flip-chip assemblies typically require an underfilling encapsulant, such as a filled epoxy formulation, to provide stress relief to the assembly and the solder bump interconnections. The precursor of the underfilling encapsulant is typically deposited adjacent to the attached component and drawn into the gap via capillary action. As the gap height decreases, difficulties can arise in drawing the encapsulant into the gap.

Consequently, a need exists for a microelectronic assembly having predetermined standoff between the component and the substrate and controlled lateral dimensions between interconnections to avoid shorting.

DETAILED DESCRIPTION OF THE PREFERRED EMBODIMENTS

The present invention forms a microelectronic assembly including an integrated circuit component attached to a substrate by a plurality of columnar interconnections. Metallic columns are deposited onto component bond pads disposed on an integrated circuit component. The metallic columns include a solder attachment surface remote from the integrated circuit component and a solder-nonwettable peripheral surface intermediate the solder attachment surface and the component bond pad. The metallic columns are formed of a first metal, preferably copper, having a first melting temperature. A solder plate is then deposited onto each solder attachment surface. The solder plate is formed of a solder having a second melting temperature that is lower than the first melting temperature. This preassembly is then superposed onto a substrate such that each solder plate contacts a corresponding substrate bond pad on the substrate. The solder is then reflowed by heating to a temperature above the second melting temperature and below the first melting temperature to bond the metallic column to the substrate bond pad and thereby attach the integrated circuit component to the substrate.

Figure 1:
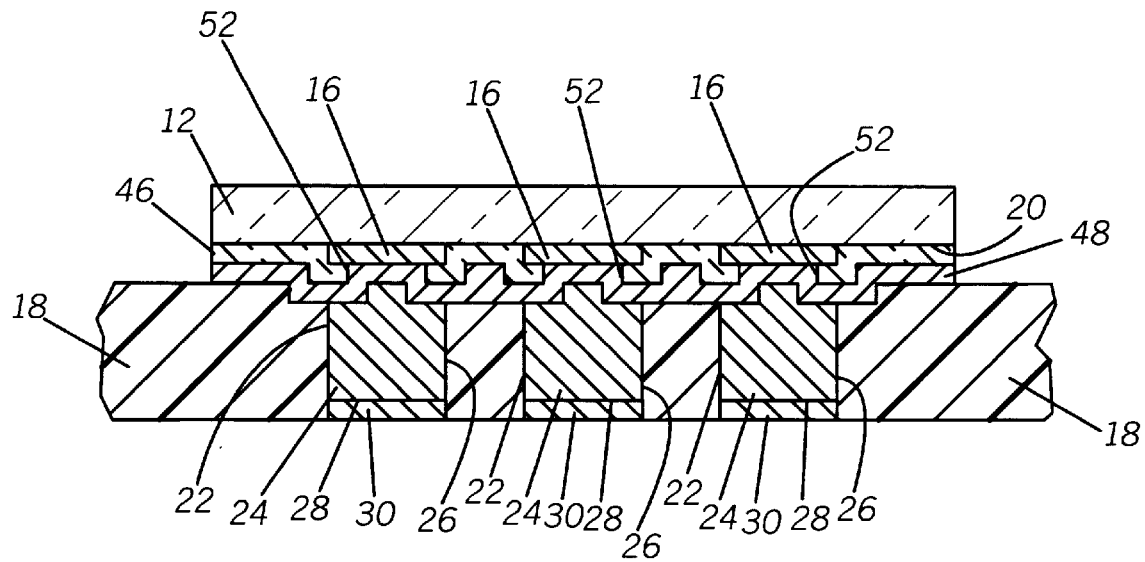
FIG. 1 is a cross-sectional view of an integrated circuit component including metallic columns that are each coated with a solder plate in accordance with a preferred embodiment of the present invention.

The present invention can be better understood with reference to FIGS. 1–4. FIG. 1 shows an integrated circuit component 12 that includes an active face 20 and a plurality of component bond pads 16 disposed on active face 20. Integrated circuit component 12 is preferably an integrated circuit die. Component bond pads 16 are formed on active face 20 and are formed of a metal that provides a suitable based for attaching columns, for example, by plating. In a preferred embodiment, component bond pads 16 are formed of aluminum. Alternately, component bond pads 16 may be formed of copper or of an alloy composed of about 2 weight percent copper, about 2 weight percent silicon, and the balance substantially aluminum. Components bond pads 16 may be formed of any metal that provides good adhesion for forming a metallic column.

Component 12 may alternately be formed of an integrated circuit package, such as a ball grid array package, formed by attaching an integrated circuit die to a carrier substrate. The integrated circuit package is formed by attaching an integrated circuit die to a die attachment surface of a carrier substrate that has bond pads formed on an active face that is opposite the die attachment surface.

A passivation layer 46 is formed on active face 20 of component 12. Passivation layer 46 is preferably formed of silicon nitride, but can alternately be formed of any dielectric layer capable of electrically isolating component bond pads 16. Passivation layer 46 includes passivation openings 52 that expose portions of component bond pads 16.

A buss layer 48 is formed over passivation layer 46 on active face 20. Buss layer 48 is preferably formed of a conductive material that provides electrical connections to component bond pads 16 to facilitate electroplating of bond pads 16. In a preferred embodiment, buss layer 48 is formed of multiple metallic layers. A first layer is formed on passivation layer 46 to provide sufficient adhesion to passivation layer 48. The first layer is preferably composed of about 50 weight percent titanium and about 50 weight percent tungsten and is preferably between about 0.1 and 0.2 microns thick. The first layer is then coated with a second layer that is preferably formed of an alloy composed of about 25 weight percent titanium, about 25 weight percent tungsten, and the balance substantially copper. The second layer is preferably between about 0.15 and 0.3 microns thick. The second layer is then coated with a layer of copper that is between about 0.5 to 1.0 microns thick.

Polymeric layer 18 is deposited onto buss layer 48. Polymeric layer 18 is formed of a photoimageable resin that is preferably spin coated onto buss layer 48. Polymeric layer 18 is suitably formed of a novolac resist system sold under the tradename AZP4620 by Hoechst Celanese Corporation. Openings 22 are formed in polymeric layer 18 such that each opening 22 exposes a component bond pad 16. Openings 22 are preferably formed by photolithography, but can alternately be formed by other suitable means, such as laser drilling or milling. Polymeric layer 18 preferably has a thickness less than about 75 microns, corresponding approximately to a preferred maximum height of the subsequently plated metallic columns. The surface of buss layer 48 is sputter cleaned within openings 22 to prepare the surface of buss layer 48 for plating with a metal.

Metallic columns 24 are then formed onto component bond pads 16 within openings 22. Metallic columns 24 are preferably formed by electroplating onto buss layer 48 within openings 22. To electroplate metallic columns 24, integrated circuit component 12 is placed into an electroplating bath. A preferred electroplating bath comprises an aqueous solution containing dissolved copper sulfate and is available from Enthone-OMI, Inc. under the trade name CU Bath. A voltage is applied to the buss layer 48 to cathodically bias buss layer 48 relative to an anode spaced apart in the bath. The electrical charge is adjusted to maintain a constant current density of between about 10 and 20 Amps /square foot. Under these circumstances, copper ions in the solution are reduced at the exposed portions of buss layer 48 within openings 22 to deposit metallic copper thereon.

Plating is continued to plate sufficient copper to form a metallic column 24 having a height greater than about 30 microns. This assures adequate stand-off between integrated circuit component 12 and substrate 14 subsequent to formation of the microelectronic assembly. In a preferred embodiment, metallic column 24 is formed of copper and has a height between about 50 and 75 microns.

In an alternate embodiment, metallic columns 24 may be formed by sputtering metal into openings 22, by electroless plating metal into openings 22, by evaporation of metal into openings 22, or by other suitable techniques. Metallic columns 24 are sputter cleaned at solder attachment surfaces 28 to prepare for plating of a solder layer onto columns 24.

Solder plates 30 are then formed on solder attachment surfaces 28 of metallic columns 24 within openings 22. Solder plates 30 are preferably formed by electroplating onto solder attachment surfaces 28. To electroplate solder plates 30, integrated circuit component 12 is placed into an electroplating bath. A preferred electroplating bath comprises an aqueous methyl sulfonic acid solution containing tin ions and lead ions and is available from Enthone-OMI, Inc. under the trade name SN60. A voltage is applied to the buss layer 48 to cathodically bias metallic columns 24 relative to an anode spaced apart from metallic columns 24 within the bath. The electrical charge applied to buss layer 48 preferably has a voltage of between about 2.95 and 3.05 volts. Under these circumstances, tin and lead ions are reduced to deposit metallic tin and lead onto columns 24 to form solder plates 30.

The resulting solder plates 30 are formed of a metallic alloy that has a lower melting temperature than that of metallic column 24. Solder plates 30 are preferably formed of a eutectic tin-lead solder being composed of between about 55 and 65 weight percent tin and the balance substantially lead and having a melting temperature of about 183° C. Solder plates 30 are preferably between about 25 and 50 microns thick. This thickness provides an adequate amount of solder for electrically and mechanically connecting component 12 and substrate 14, but does not provide an excess that might overflow substrate bond pads 32 and lead to potential problems of shorting between adjacent substrate bond pads.

Figure 2:
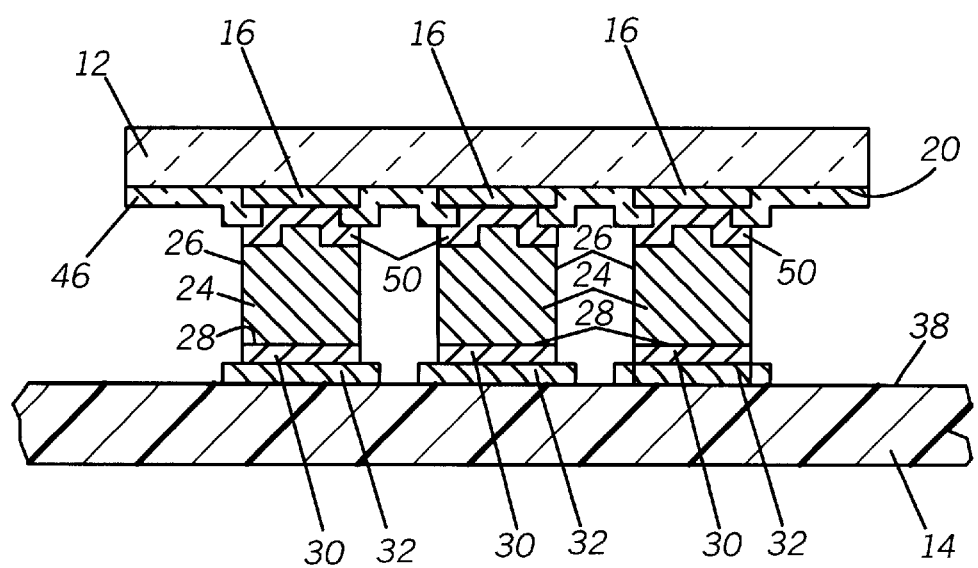
FIG. 2 is a cross-sectional view of a preassembly formed by superposing the integrated circuit component in FIG. 1 onto a substrate.

After formation of solder plates 30, polymeric layer 18 is removed from integrated circuit component 12 to exposed metallic columns 24. Polymeric layer 18 can be chemically etched or removed by any other suitable technique. Removal of polymeric layer 18 exposes the peripheral surfaces 26 to air, resulting in an oxidized peripheral surface 26. Solder plate 30 protects solder attachment surface 28 from exposure to air, thereby virtually eliminating oxidation from occurring on solder attachment surface 28. Buss layer 48 is then removed on component 12 in all areas other than between metallic columns 24 and component bond pads 16 to electrically isolate metallic columns 24. A small portion of buss layer 48 remains as a conductive layer 50 between each metallic column 24 and component bond pad 16, as depicted in FIG. 2. Integrated circuit component 12 is then superposed onto a substrate 14 for connection thereto.

Substrate 14 is preferably a laminated printed circuit board comprising a resin and glass fiber composite, such as a bismaleimide triazine composite or FR4. Substrate 14 may alternately be formed of ceramic, silicon, glass-filled epoxy resin, arimid, polyester, twice deposited dielectrics, or polyimide. Alternately, substrate 14 could be formed of an integrated circuit die or a flexible substrate. Substrate 14 includes a plurality of bond pads 32 located at a die attach region 38.

Integrated circuit component 12 is superposed such that each solder plate 30 registers with a corresponding substrate bond pad 32. Substrate bond pads 32 are preferably formed of copper, but can alternately be formed of any solder-wettable metal. In a preferred embodiment, a fluxing agent is dispensed onto substrate bond pads 32 prior to superposition of die 12. The fluxing agent is preferably a no-clean flux containing an acid fluxing vehicle, such as succinic acid, glutaric acid, adipic acid, or a combination of the above.

Figure 3:
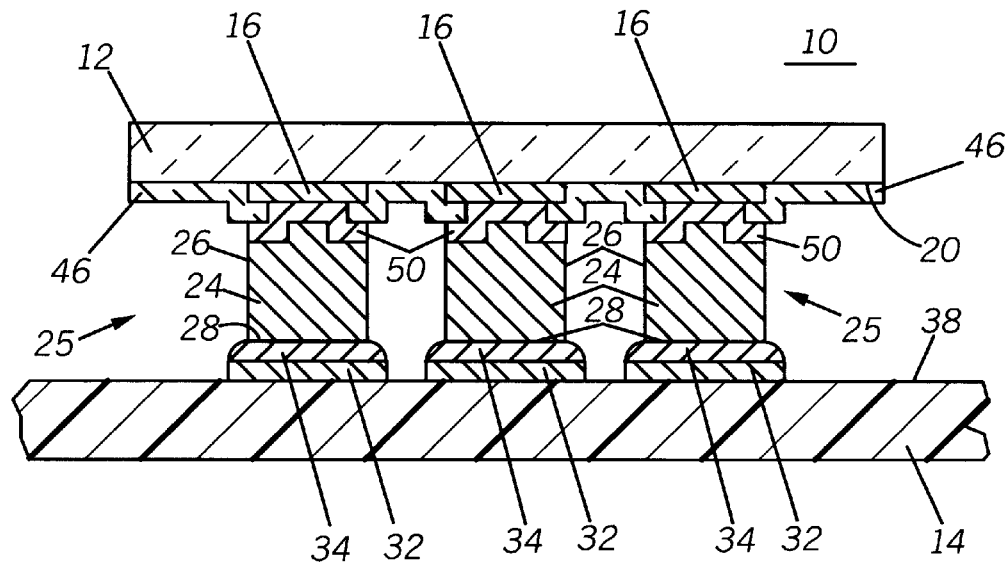
FIG. 3 is a cross-sectional view of a microelectronic assembly formed by heating the preassembly of FIG. 2 to reflow the solder plate to form a solder joint connecting the integrated circuit component and the substrate.

Component 12 and substrate 14 are then reflowed by heating at a temperature above the second melting temperature of solder plate 30 but below the first melting temperature of metallic column 24 to reflow solder plate 30 as depicted in FIG. 3. Reflowing is preferably carried out between about 180° C. and 230° C.

In a preferred embodiment, component 12 and substrate 14 are raised from room temperature to about 150° C. at a ramp up rate no faster than about 2° C. per second. This gradual ramp up rate prevents the solvent that the fluxing agent is dissolved in from boiling off to quickly, which could cause component 12 to skew from substrate bond pads 32. Component 12 and substrate 14 are then heated at between about 130° C. and 170° C. for about 2 minutes, and then heated to a temperature of between about 180° C. and 230° C. for between about 30 seconds and two minutes. This temperature and time have been found to assure adequate melting of solder plate 30 without damaging component 12 or altering the shape of metallic columns 24. The preassembly is then cooled down to room temperature at a cool down rate of less than about 4° C. per second.

The reflowed solder melts onto substrate bond pads 32. Component 12 and substrate 14 are then cooled to solidify the solder to form solder joints 34. Solder joints 34 are bonded to substrate bond pads 32 and solder attachment surface 28 of metallic column 24. Solder joints 34 having a height of between about 10 and 40 microns have been found to provide satisfactory electrical connection, while also providing adequate mechanical strength to provide a reliable joint. Below 10 microns, adequate plating cannot be ensured, while above 40 microns, excess solder may lead to potential problems of shorting between adjacent bond pads.

Solder joints 34 do not form a metallurgical connection with solder-nonwettable peripheral surfaces 26. Component bond pads 16 and substrate bond pads 32 are preferably solder-wettable, while peripheral surfaces 26 are preferably solder-nonwettable. As used herein, solder-wettable refers to a metal where a liquid solder forms a film that "wets", or spreads across, the metal surface of a solder-wettable metal. This phenomenon is caused by surface tension of the liquid relative to the metal surface. When the solder solidifies, the solder becomes bonded to the metal. Wetting of the metal surface provides intimate contact between the solder and the metal that is essential in forming a strong metallurgical bond to the surface. Peripheral surfaces 26 oxidize upon exposure to air, and the oxidation is increased by heating during reflow. This prevents solder plate 30 from wetting peripheral surfaces 26. Solder plates 30 protect solder attachment surface 28 from oxidation. By maintaining solder joints 34 on solder attachment surface 28, the width of the interconnection between integrated circuit component 12 and substrate 14 can be accurately predicted and controlled. This allows the pitch of the bond pads to be reduced to a size smaller than previous assemblies, since there is no collapse and no expansion of metallic column 24, which could lead to shorting between adjacent interconnections.

Peripheral surfaces 26 are preferably readily oxidizable. Oxidation leads to peripheral surfaces 26 being generally solder-nonwettable. The oxidation of peripheral surfaces 26 is preferably accomplished by allowing peripheral surfaces to be exposed to ambient atmosphere, such as air. In this manner, peripheral surface 26 of metallic column 24 may be oxidized to prevent solder plate 30 from wetting peripheral surfaces 26 by making peripheral surface 26 solder-nonwettable.

Figure 4:
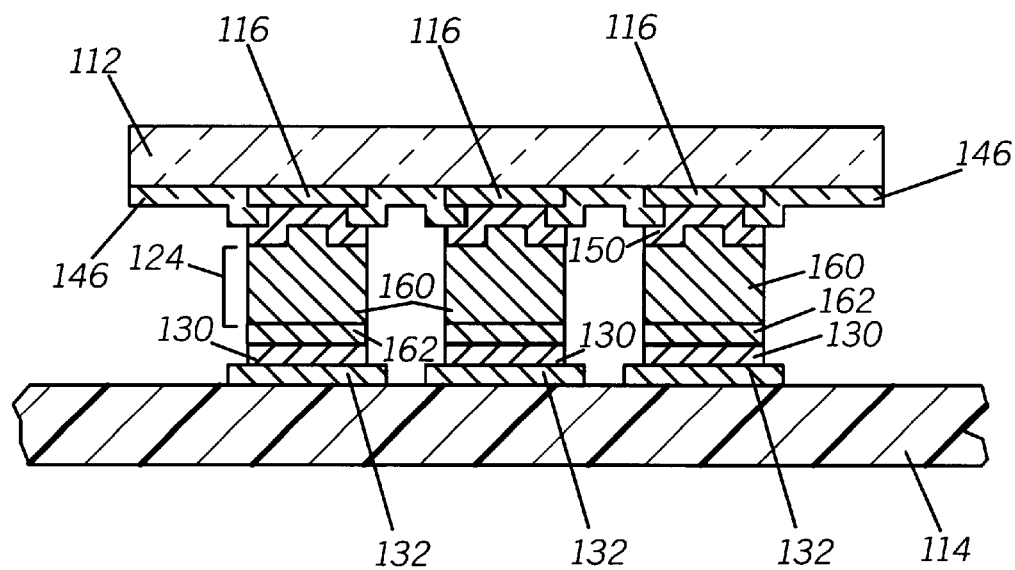
FIG. 4 is a cross-sectional view of a preassembly including metallic columns that are each formed of a first portion and a second portion in accordance with an alternate embodiment of the present invention.

In an alternate embodiment, as depicted in FIG. 4, metallic column 124 is formed by electroplating a first column section 160 of a first metal and electroplating a second column section 162 formed of a second metal onto first column section 160. First column section 160 and second column section 162 cooperate to form metallic column 124. First column section 160 is preferably composed of copper and is about 45 to 60 microns thick. Second column section 162 is preferably about 5 to 15 microns thick and is formed of nickel, which oxidizes more readily than copper. The increased oxidation of second column section 162 provides an enhanced barrier to prevent the spread of solder during reflow. Solder plate 130 is then electroplated onto second column section 162 using the same technique as in the preferred embodiment. Integrated circuit component 112 is then superposed onto substrate 114, at which time processing continues as in the preferred embodiment to form a microelectronic assembly.

The present invention thereby provides a microelectronic assembly 10 and the method for forming assembly 10 wherein assembly 10 includes electroplated columnar interconnections 25. Columnar interconnections 25 are preferably formed by electroplating a metallic column 24 onto bond pads 16 on integrated circuit component 12. Metallic columns 24 are preferably formed of a metal that is solderable in a clean state, but is an oxidizable metal to form a solder-nonwettable surface. Nickel and copper are preferred metals. A solder plate 30 is plated onto metallic columns 24. To form microelectronic assembly 10, solder plate 30 is reflowed by heating above its melting temperature to form a solder joint 34 between metallic column 24 and substrate bond pad 32. The solder joint 34 does not wet the peripheral surfaces 26 of metallic column 24, and consequently solder joint 34 is formed between the solder attachment surface 28 of column 24 and substrate bond pad 32. In this manner, multiple advantages are realized.

One advantage is no increase in the width of the interconnections, as is common in typical flip-chip assemblies. In the present invention, the problem of shorting between adjacent interconnections has been removed by forming the interconnections out of a metallic column that is not reflowed. In this manner, the width of the interconnection is tightly controlled, and the interconnection does not increase in width during reflow. Consequently, the pitch of the assembly can be reduced, which leads to finer pitch assemblies.

A further advantage to the present invention is the reduction of collapse of the component toward the substrate during reflow. This increased standoff between the component and the substrate lead to less stress in the interconnections, as the stresses are distributed over the height of the interconnections. In fine pitch assemblies, collapse of the component can also lead to gaps that have a height that prevents reliable underfilling of the component. In the present invention, the integrated circuit component does not collapse, and consequently the gap between the component and the substrate is maintained at an adequate height to dispose a polymeric precursor into the gap. The precursor is then cured to form an encapsulant that provides protection for the interconnections and distributes stress in the assembly to form a more reliable assembly.

In addition, the copper columns provide enhanced strength of the interconnections due to the increased strength of copper over relatively soft solder alloys, such as tin and lead.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A method for forming a microelectronic assembly including an integrated circuit component attached to a substrate by columnar interconnections, the method comprising:

depositing metallic columns onto component bond pads disposed on an integrated circuit component, each said metallic column comprising a solder attachment surface remote from the component bond pad and a peripheral surface intermediate the solder attachment surface and the component bond pad, each said metallic column formed of a first metal having a first melting temperature;

depositing a solder plate onto each solder attachment surface, said solder plate being formed of a solder having a second melting temperature lower than the first melting temperature;

oxidizing the peripheral surfaces of the metallic columns to inhibit wetting by solder during reflow;

superposing the integrated circuit component onto a substrate such that each solder plate contacts a corresponding substrate bond pad on the substrate; and reflowing the solder by heating at a temperature above the second melting temperature and below the first melting temperature to bond the metallic column to the substrate bond pad and thereby attach the integrated circuit component to the substrate.

2. A method for manufacturing a microelectronic assembly in accordance with claim 1, wherein the step of depositing metallic columns comprises electroplating copper onto the component bond pads.

3. A method for manufacturing a microelectronic assembly in accordance with claim 1, wherein the step of depositing a solder plate comprises electroplating solder onto the metallic columns.

4. A method for forming a microelectronic assembly including an integrated circuit component attached to a substrate by columnar interconnections, the method comprising:

fabricating an integrated circuit component comprising a plurality of component bond pads;

plating a first metal having a first melting temperature onto the component bond pads to form metallic columns, each said metallic column having a solder attachment surface remote from the face and a peripheral surface intermediate the component bond pad and the solder attachment surface;

plating a solder plate onto each solder attachment surface, said solder plate being formed of a solder alloy having a second melting temperature lower than the first melting temperature;

oxidizing the peripheral surfaces of the metallic columns, said solder plate protecting the solder attachment surfaces from oxidation;

superposing the integrated circuit component onto a substrate including a plurality of substrate bond pads formed of a solder-wettable metal, such that each solder plate contacts a corresponding substrate bond pad; and reflowing the solder plate by heating at a temperature above the second melting temperature and below the first melting temperature to melt the solder alloy and thereafter cooling to resolidify the solder alloy to thereby join the metallic column to the substrate bond pad and attach the integrated circuit component to the substrate.

5. A method for forming a microelectronic assembly in accordance with claim 4, wherein the step of plating a first metal comprises electroplating copper onto the component bond pad.

6. A method for forming a microelectronic assembly in accordance with claim 4, wherein the step of plating a solder plate comprises electroplating a tin-base solder alloy onto the metallic column.

7. A method for forming a microelectronic assembly in accordance with claim 4, wherein the step of plating a first metal comprises depositing a metallic column having a height of between about 50 and 75 microns.

8. A method for forming a microelectronic assembly in accordance with claim 4, wherein the step of reflowing is carried out at between about 180° C. and 230° C.

9. A method for forming a microelectronic assembly in accordance with claim 4, wherein the step of plating a first metal comprises:

plating a first column section composed of a first metal onto the component bond pad; and plating a second column section composed of a second metal distinct from the first metal onto the first column section.

10. A method for forming a microelectronic assembly in accordance with claim 4, wherein the step of plating a first metal comprises plating a metallic column having a height of at least 30 microns.

11. A method for forming a microelectronic assembly including an integrated circuit component attached to a substrate by a plurality of columnar interconnections, the method comprising:

fabricating an integrated circuit component, said integrated circuit component having a face and a plurality of component bond pads formed on the face;

depositing a polymeric layer onto the face, the polymeric layer comprising a plurality of openings that expose the component bond pads;

electroplating copper metal onto the exposed component bond pad within the openings to form metallic columns, each said metallic column having a peripheral surface and a solder attachment surface;

electroplating a tin-base solder onto the solder attachment surface within the opening to form a solder plate;

removing the polymeric layer on the active face;

oxidizing the peripheral surfaces to form a solder-nonwettable oxidized surface, whereby the solder plate protects the solder attachment surface from oxidization;

superposing the integrated circuit component onto a substrate including a plurality of substrate bond pads formed of a solder-wettable metal, such that the solder plates contact each of the substrate bond pads; and heating at a temperature effective to melt the solder without melting the copper, whereupon the solder wets the solder attachment surface and the substrate bond pad, and thereafter cooling to resolidify the solder to form a solder joint bonding the metallic column and the substrate bond pad.

12. A method for forming a microelectronic assembly in accordance with claim 11, wherein the step of electroplating copper metal comprises electroplating a metallic column having a height of about 30 microns.

13. A method for forming a microelectronic assembly in accordance with claim 11, wherein the step of electroplating copper metal comprises electroplating a metallic column having a height of between about 50 and 75 microns.

14. A method for forming a microelectronic assembly in accordance with claim 11, wherein the step of electroplating copper metal comprises:

plating a first section composed of copper onto the component bond pad; and plating a second section composed of nickel onto the first section.

* * * * *